United States Patent
Xie et al.

(10) Patent No.: US 9,202,905 B1
(45) Date of Patent: Dec. 1, 2015

(54) DIGITAL ALLOY LAYER IN A III-NITRADE BASED HETEROJUNCTION FIELD EFFECT TRANSISTOR

(71) Applicant: TriQuint Semiconductor, Inc., Hillsboro, OR (US)

(72) Inventors: Jinqiao Xie, Allen, TX (US); Edward A. Beam, III, Plano, TX (US); Ming-Yih Kao, Dallas, TX (US); Hua-Quen Tserng, Dallas, TX (US); Paul Saunier, Dallas, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 14/480,404

(22) Filed: Sep. 8, 2014

(51) Int. Cl.
  *H01L 29/20* (2006.01)
  *H01L 29/778* (2006.01)
  *H01L 29/205* (2006.01)

(52) U.S. Cl.
  CPC ........ *H01L 29/7783* (2013.01); *H01L 29/2003* (2013.01); *H01L 29/205* (2013.01)

(58) Field of Classification Search
  CPC ............ H01L 29/2003; H01L 29/7787; H01L 29/66462; H01L 29/201; H01L 21/0254; H01L 29/7786; H01L 21/02458; H01L 29/1075; H01L 29/205; H01L 29/42316; H01L 29/475
  See application file for complete search history.

(56) References Cited

U.S. PATENT DOCUMENTS 7,547,925 B2 * 6/2009 Wong et al. ............. 257/103
2012/0292632 A1 * 11/2012 Shioda et al. ............. 257/76

OTHER PUBLICATIONS

Chen, M. Na., et al.; "Above-room temperature ferromagnetism in GaSb/Mn digital alloys;" Applied Physics Letters; vol. 81, No. 3; pp. 511-513; Jul. 2012.
Kawakami, Y., et al.; Improved electrical properties in AlGaN/GaN heterostructures using AiN/GaN superlattice as a quasi-AlGaN barrier; Applied Physics Letters 90-242112; American Institute of Physics; 2007.
Lin, D.Y., et al.; "Piezoreflectance and photoreflectance study of GaAs/AlGaAs digital alloy compositional graded structures;" American Institute of Physics; J. Appl. Phys. 79; pp. 460-466; Jan. 1996.
Liu, G.T., et al.; '1.58-um Lattice-Matched and strained digital alloy AlGaInAs—InP Multiple-Quantum-Well Lasers; IEEE Transactions on Photonics Letters, vol. 12, No. 1, Jan. 2000.
Nikishin, Sergey A., et al.; "Digital Alloys of AlN/AlGaN for Deep UV Light Emitting Diodes;" Japanese Journal of Applied Physics; vol. 44, No. 10, pp. 7221-7226; 2005.
Wang; Hong-Mei, et al.; "AlN/AlGaN superlattices as dislocation filter for low-threading-dislocation thick AlGaN layers on sapphire;" Applied Physics Letters, vol. 81, No. 4; Jul. 2002.
Yagi, Shuichi, et al.; "Demonstration of Quasi-AlGaN/GaN HFET Using Ultrathin GaN/AlN Superlattices as a Barrier Layer;" IEEE Electron Device Letters, vol. 31, No. 9, pp. 945-947; Sep. 2010.

* cited by examiner

*Primary Examiner* — Roy Potter
*Assistant Examiner* — Paul Patton
(74) *Attorney, Agent, or Firm* — Withrow & Terranova, P.L.L.C.

(57) ABSTRACT

Embodiments include apparatuses and methods related to an HFET. In embodiments, one or all of the buffer layer, the back-barrier layer, or the barrier layer may be formed of a digital alloy. In embodiments, the digital alloy may include alternating layers of alloys of aluminum, gallium, and nitrogen. Other embodiments may be disclosed or claimed herein.

20 Claims, 11 Drawing Sheets

DIGITAL ALLOY LAYER IN A III-NITRADE BASED HETEROJUNCTION FIELD EFFECT TRANSISTOR

FIELD

Embodiments of the present disclosure relate generally to the field of circuits, and more particularly to III-Nitride based heterojunction field effect transistors (HFETs).

BACKGROUND

Conventional III-Nitride based HFET structures are typically fabricated on a gallium nitride (GaN) buffer layer. As device scaling geometries are reduced to achieve higher frequency applications, short channel effects need to be minimized. To improve the carrier confinement and sub-threshold characteristics, a back-barrier may be added before the channel layer. Typically, aluminum gallium nitride ($Al_xGa_{1-x}N$) alloys have been used as the back-barrier due to their wider band-gaps than the GaN channel. In most cases, these alloys comprise the buffer layer and are not just an added layer to the structure. However, there are several limitations related to using AlGaN alloys. Specifically, in conventional alloys, the aluminum (Al) composition normally needs to be kept low, on the order of less than 8%, to avoid degradation of crystalline quality under normal growth conditions. Additionally, the thermal conductivity of the buffer may be degraded as the aluminum concentration is increased.

In some cases, GaN based HFETs typically have AlGaN as the barrier layer. To scale down the gate length for high frequency applications and minimize short channel effects, the thickness of the barrier layer needs to be scaled down accordingly. For example, a gate length less than 0.30 microns (μm) is desired for high frequency application with a barrier layer thickness less than 200 Angstroms (A). However, with traditional AlGaN barriers, such scaling becomes unsuitable. To obtain high channel conductivity with a thin barrier, the Al concentration in the barrier needs to be increased significantly. This increase in Al concentration may result in enhanced alloy scattering that degrades the electron mobility. Furthermore, the crystal quality of AlGaN with high Al concentration may be poor, which may not be desirable for fabricating highly reliable devices. Though other approaches like indium aluminum nitride (InAlN) have been tried, the breakdown voltage and reliability are limited due to poor crystalline quality.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Embodiments include apparatuses and methods related to HFETs. In embodiments, one or all of the buffer layer, the back-barrier layer, or the barrier layer may be formed of a digital alloy. In embodiments, the digital alloy may include alternating layers of alloys of aluminum, gallium, and nitrogen. Specifically, in some embodiments, the barrier layer may be formed of alternating layers of gallium nitride (GaN) and aluminum nitride (AlN). In some embodiments, the buffer layer or back-barrier layer may be formed of alternating layers of $Al_yGa_{1-y}N$ and $Al_xGa_{1-x}N$. Other embodiments may be disclosed or claimed herein.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
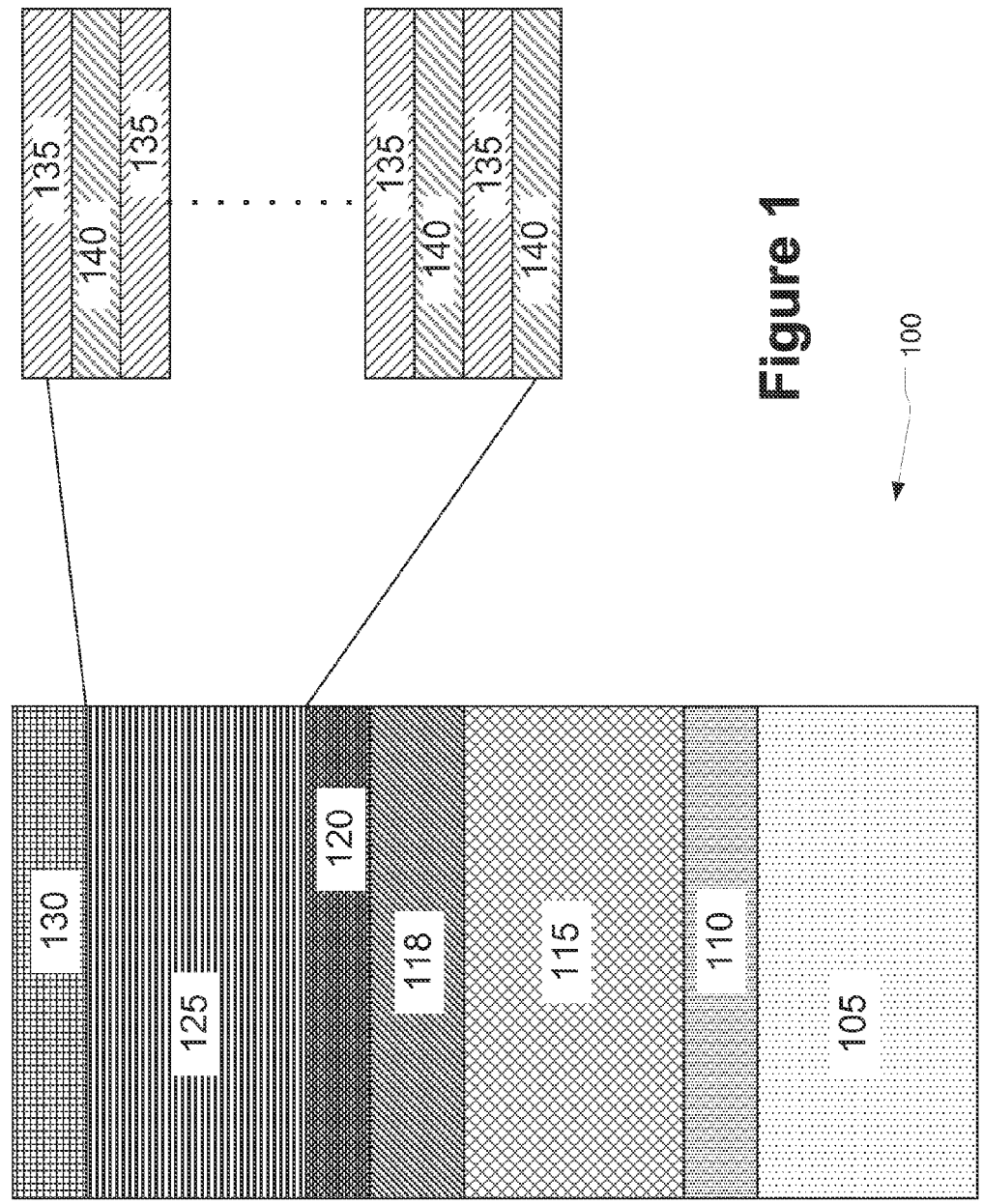
FIG. 1 illustrates an example HFET with a barrier layer that includes a digital alloy, in accordance with various embodiments.
Figure 6:
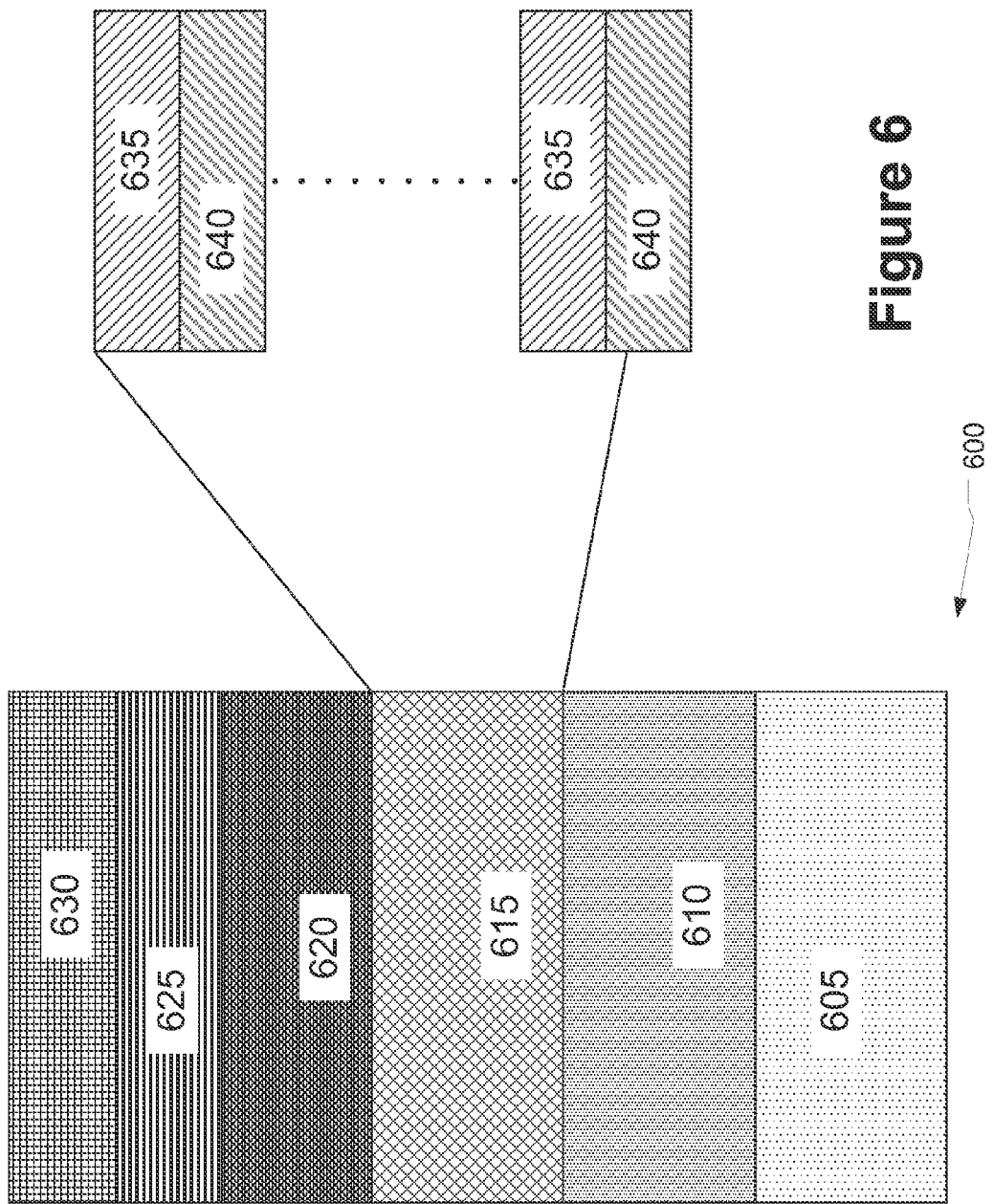
FIG. 6 illustrates an example HFET with a back-barrier or buffer layer that includes a digital alloy, in accordance with various embodiments.
Figure 9:
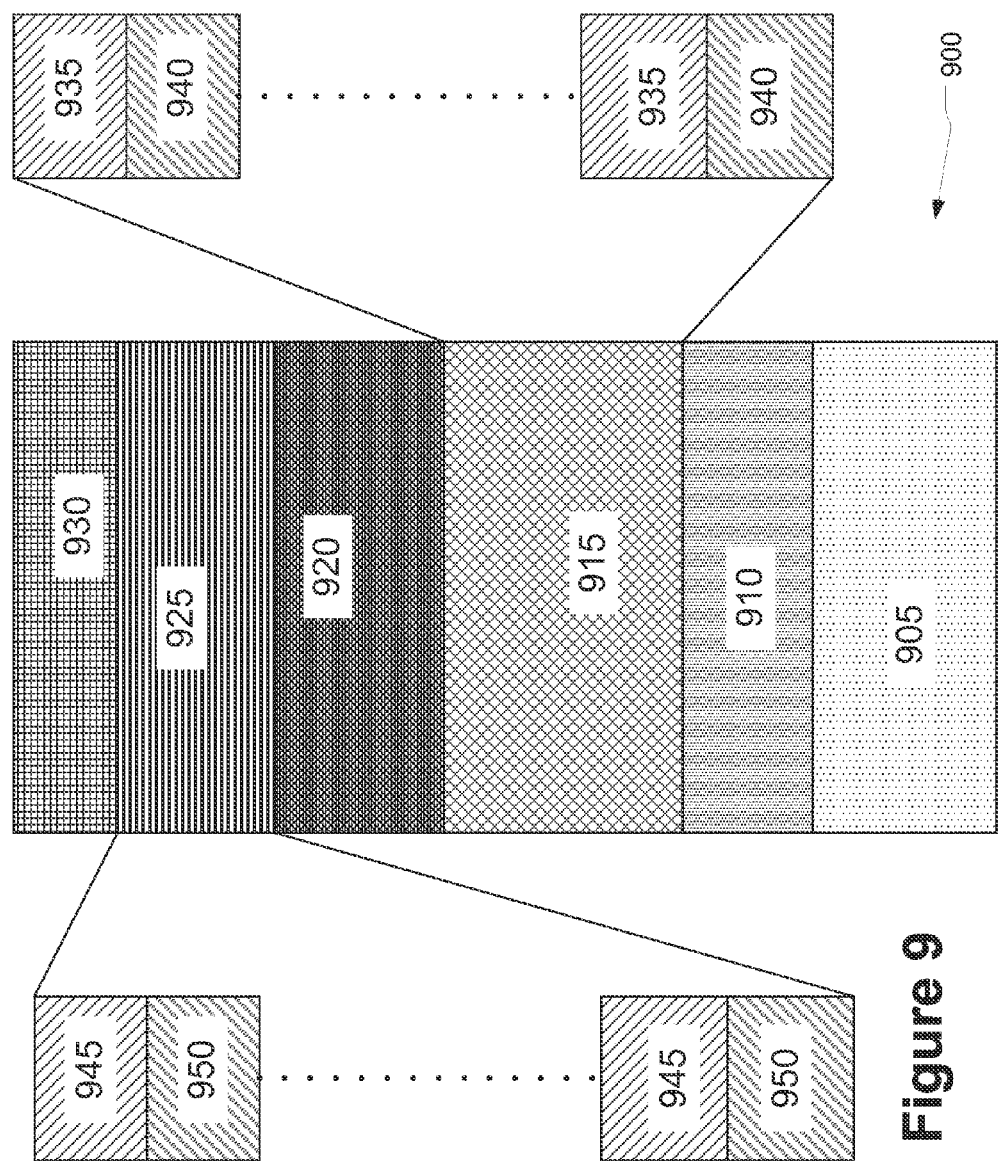
FIG. 9 illustrates an example HFET with a back-barrier or buffer layer that includes a digital alloy and a barrier layer that includes a digital alloy, in accordance with various embodiments.

FIG. 1, 6, or 9 may depict various vertical stacks of layers which may be epitaxially deposited or otherwise formed. The sizes, widths, or heights of the various layers are not drawn to scale, and should not be assumed to be limited to being identical to, or different from, one another unless explicitly indicated to be so in the description below.

As noted above, in some cases, GaN based HFETs may typically have AlGaN as the barrier layer. However, to obtain high channel conductivity with a thin barrier layer, the Al concentration in the barrier may need to be increased significantly. This increased concentration may result in enhanced alloy scattering that may consequently degrade electron mobility. Furthermore, the crystal quality of AlGaN with high Al concentration may be poor, which may not be desirable for fabricating highly reliable devices.

Embodiments proposed herein may include the use of a digital alloy in the barrier layer (hereinafter referred to as a "digital barrier layer" or a "digital alloy barrier layer"), which may contain alternating layers of AlN and GaN binary materials. Generally, "digital" may refer to the layer including discrete alternating layers of alloys or materials. The effective Al concentration of the digital alloy barrier layer may be controlled by the total thickness ratio of AlN to GaN within the digital alloy barrier layer. The thickness of each AlN or GaN layer within the barrier may be either constant or varied. That is, in some embodiments the thicknesses of each AlN layer of the digital alloy barrier layer may be the same as the thicknesses of each GaN layer of the digital alloy barrier layer. In some embodiments the thicknesses of each AlN layer may be the same thicknesses as one another, and the thicknesses of each GaN layer may be the same thicknesses as one another, but the thicknesses of the AlN and the GaN layers may be different. In some embodiments, the thicknesses of one or more of the AlN layers may be different from others of the one or more AlN layers of the digital alloy barrier layer, or the thicknesses of one or more of the GaN layers may be different from others of the one or more GaN layers of the digital alloy barrier layer.

When the thicknesses of the AlN and GaN layers of the digital alloy barrier layer are constant or approximately constant, and there is a repeating period (that is, alternating layers of AlN and GaN layers), the digital alloy may be called a superlattice. In some cases, due to the strong polarization of AlN, the sheet carrier concentration of a digital alloy barrier layer may reach relatively high densities, such as at or above $1 \times 10^{13}$ cm$^{-2}$, even for a relatively thin barrier layer. With a barrier layer made of a digital alloy, alloy scattering may be reduced or eliminated, which may significantly increase channel electron mobility. Additionally, a high effective Al concentration may be achieved without degrading the crystal quality, which may be considered necessary or essential for some implementations.

FIG. 1 depicts an example HFET 100 with a digital alloy barrier layer. Certain layers discussed below with respect to HFET 100 may be described with a specific thickness; however, it will be understood that the described thickness is only for one embodiment of an HFET with a digital alloy barrier layer. In other embodiments, the thicknesses of one or more of the layers may be thicker than, or thinner than, the thicknesses described below.

The HFET 100 may include a substrate layer 105, which may include or be formed of one or more of silicon carbide (SiC), Si, GaN, AlN, sapphire, zinc oxide (ZnO), related alloy or digital alloy buffers, or alloys or combinations thereof. In embodiments, the substrate layer 105 may be insulating or semi-insulating. A nucleation layer 110 may be epitaxially deposited, laminated, or otherwise formed on the substrate layer 105. In some embodiments, the formation of the nucleation layer 110 on the substrate layer 105 may be the result of the application of a chemical, optical, or mechanical process to the substrate layer 105. In embodiments, the nucleation layer 110 may be formed of or otherwise include AlN and may be approximately 10 nanometers (nm) thick. As discussed herein, thickness will be referred to as the vertical distance with respect to FIG. 1.

One or more of a buffer layer and/or a back-barrier layer may be laminated, epitaxially deposited, or otherwise formed on the nucleation layer 110. As shown in FIG. 1, a buffer layer 115 may be formed on the nucleation layer 110. In embodiments, the buffer layer 115 may include GaN, AlGaN, AlN, some other buffer layer material, or combinations or alloys thereof. In some embodiments, the buffer layer 115 may be doped with one or more materials such as iron (Fe), carbon (C), zinc (Zn). In some embodiments, as described below, the buffer layer 115 may also include one or more digital alloy layers. In some embodiments, the buffer layer 115 may be considered a back-barrier layer, which may confine the electron channel of the channel layer 120. In some embodiments, the buffer layer may have a thickness of approximately 1000 nm.

The HFET 100 may further include a channel layer 120, which may be epitaxially deposited, laminated, or otherwise formed on the buffer layer 115. In some embodiments, the channel layer 120 may include or be formed of GaN, InGaN, AlGaN, some other channel layer material, or combinations or alloys thereof. In general, the material of the channel layer 120 may be chosen from a material that has a band-gap that is less than the effective band-gap of a barrier layer of the HFET 100, which will be described in greater detail below. In some embodiments, the channel layer may have a thickness of approximately 300 Å.

In some embodiments, a graded layer 118 may be epitaxially deposited, laminated, or otherwise formed between the channel layer 120 and the buffer layer 115. For example, as shown in FIG. 1, the graded layer 118 may have a thickness of approximately 700 nm, and may include GaN that is doped with Fe. However, because the buffer layer 115 may be GaN that is doped with Fe, and the channel layer 120 may be undoped GaN, the graded layer 118 may be deposited such that the graded layer 118 is more heavily doped at a portion of the graded layer 118 that is closer to the buffer layer 115, and less heavily doped at a portion of the graded layer 118 that is closer to the channel layer 120. In some embodiments, the graded layer 118 may include one or more other alloys or materials to form a relatively smooth transition between the materials or alloys of the buffer layer 115 and the materials or alloys of the channel layer 120.

The HFET 100 may further include a digital alloy barrier layer 125. In embodiments, the digital alloy barrier layer 125 may be comprised of alternating layers of GaN (hereinafter referred to as GaN layers 135) and AlN (hereinafter referred to as AlN layers 140). In embodiments, the digital alloy barrier layer 125 may include three GaN layers 135 alternating with four AlN layers 140. In other embodiments, the digital alloy barrier layer 125 may include more or fewer GaN layers 135 and/or AlN layers 140. Although the "top" of the digital alloy barrier layer 125 (that is, the layer of the digital alloy barrier layer 125 that is farthest from the substrate layer 105) is depicted as being a GaN layer 135, and the "bottom" of the digital alloy barrier layer 125 (that is, the layer of the digital alloy barrier layer 125 that is closest to the substrate layer 105) is depicted as being an AlN layer 140, in other embodiments the "top" of the digital alloy barrier layer 125 may be an AlN layer 140, and/or the "bottom" of the digital alloy barrier layer 125 may be a GaN layer 135.

As noted above, in some embodiments the thicknesses of each of the AlN layers 140 may be the same as one another, while in other embodiments the thicknesses of one or more of the AlN layers 140 may be different from the thicknesses of another one or more of the AlN layers 140. Similarly, in some embodiments the thicknesses of each of the GaN layers 135 may be the same as one another, while in other embodiments the thicknesses of one or more of the GaN layers 135 may be different from the thicknesses of another one or more of the GaN layers 135. In some embodiments, the thicknesses of the GaN layers 135 may be the same as the thicknesses of the AlN layers 140, whereas in other embodiments the thicknesses of the GaN layers 135 may be different than the thicknesses of the AlN layers 140. In some embodiments the thicknesses of each of the GaN layers 135 may be the same as one another, and the thicknesses of each of the AlN layers 140 may be the same as one another, which may be known as a superlattice.

In embodiments, the digital alloy barrier layer 125 may be formed through epitaxial deposition, laminating, or some other process. In some embodiments, the digital alloy barrier layer 125 may be deposited on the channel layer 120 to form a two dimensional electron gas (2DEG). In embodiments, the effective Al concentration of the digital alloy barrier layer 125 may be determined based on the total thickness ratio of the AlN layers 140 and the GaN layers 135. Specifically, the effective Al concentration (Al %) may be estimated as Al %=(total thickness of AlN layers 140)/((total thickness of AlN layers 140)+(total thickness of GaN layers 135)). In some embodiments, each of the AlN layers 140 may have a thickness of approximately 7.5 A. In some embodiments, each of the GaN layers 135 may have a thickness of approximately 16.5 A.

The HFET 100 may further include a cap layer 130. In embodiments, the cap layer 130 may be formed of high temperature GaN, low temperature AlN, low temperature GaN, in-situ Silicon Nitride ($SiN_x$), or some other material. The cap layer 130 may be formed by epitaxial deposition on the digital alloy barrier layer 125, lamination, or some other process. In embodiments, the cap layer 130 may significantly increase overall reliability of the HFET 100. Specifically, the cap layer 130 may increase the overall reliability of the HFET 100 because the cap layer 130 may reduce oxidation of the barrier layer 125. In some embodiments, the cap layer 130 may have a thickness of approximately 20 A.

The HFET 100 of FIG. 1 may enjoy several features or benefits. Specifically, in some embodiments the digital alloy barrier layer 125 formed of AlN layers 140 and GaN layers 135 may reduce or eliminate alloy scattering and boost electron mobility. For example, in some embodiments, an electron mobility greater than 2200 $cm^2/V \cdot s$ has been achieved where $cm^2$ refers to centimeters squared, V refers to voltage, and s refers to seconds. Additionally, because certain layers of the digital alloy barrier layer 125 contain Al, and certain layers either do not contain Al or contain a very low concentration of Al, a high effective Al concentration may be achieved by tuning the thickness ratio of AlN layers 140 to GaN layers 135, as described above with respect to Al %. Finally, the total barrier thickness may be controlled by the total number of AlN layers 140 and the GaN layers 135, and in embodiments a high channel conductivity for the HFET 100 may be achieved with a relatively thin barrier layer 125 thickness.

Figure 2:
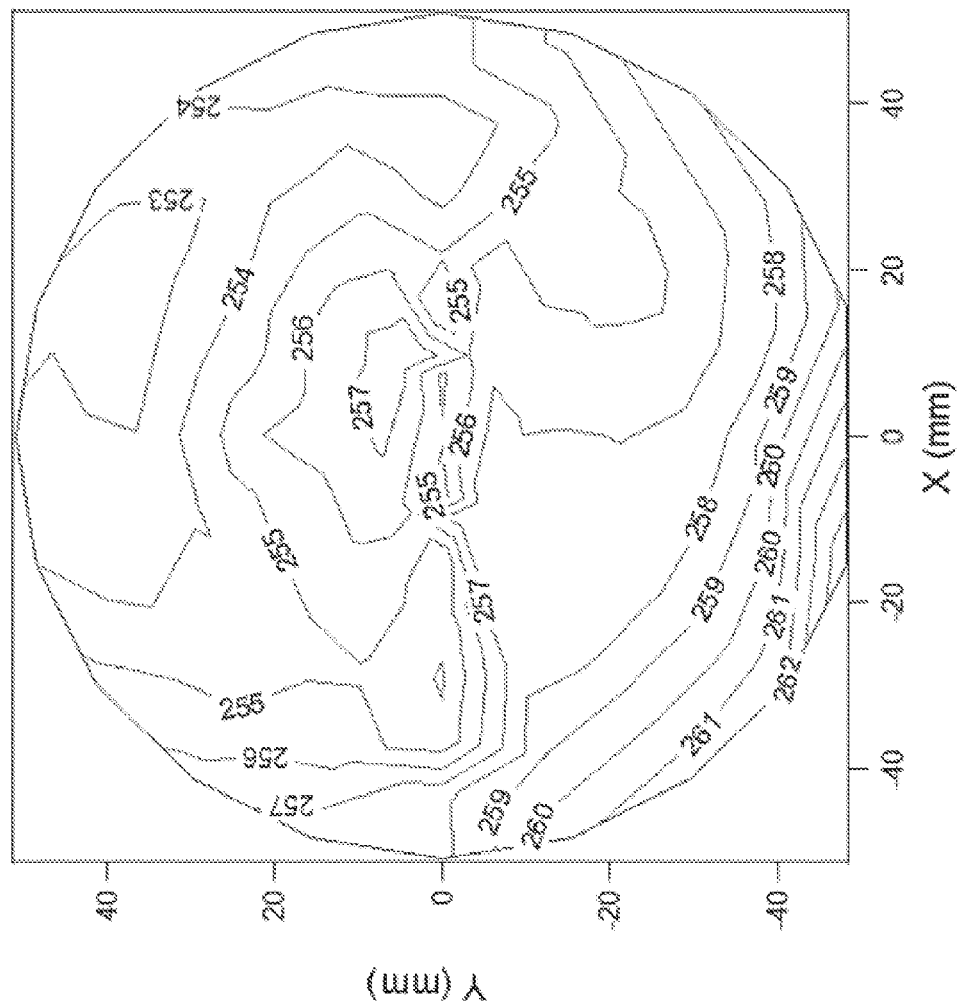
FIG. 2 illustrates an example sheet resistance map of an embodiment of the HFET of FIG. 1, in accordance with various embodiments.
Figure 3:
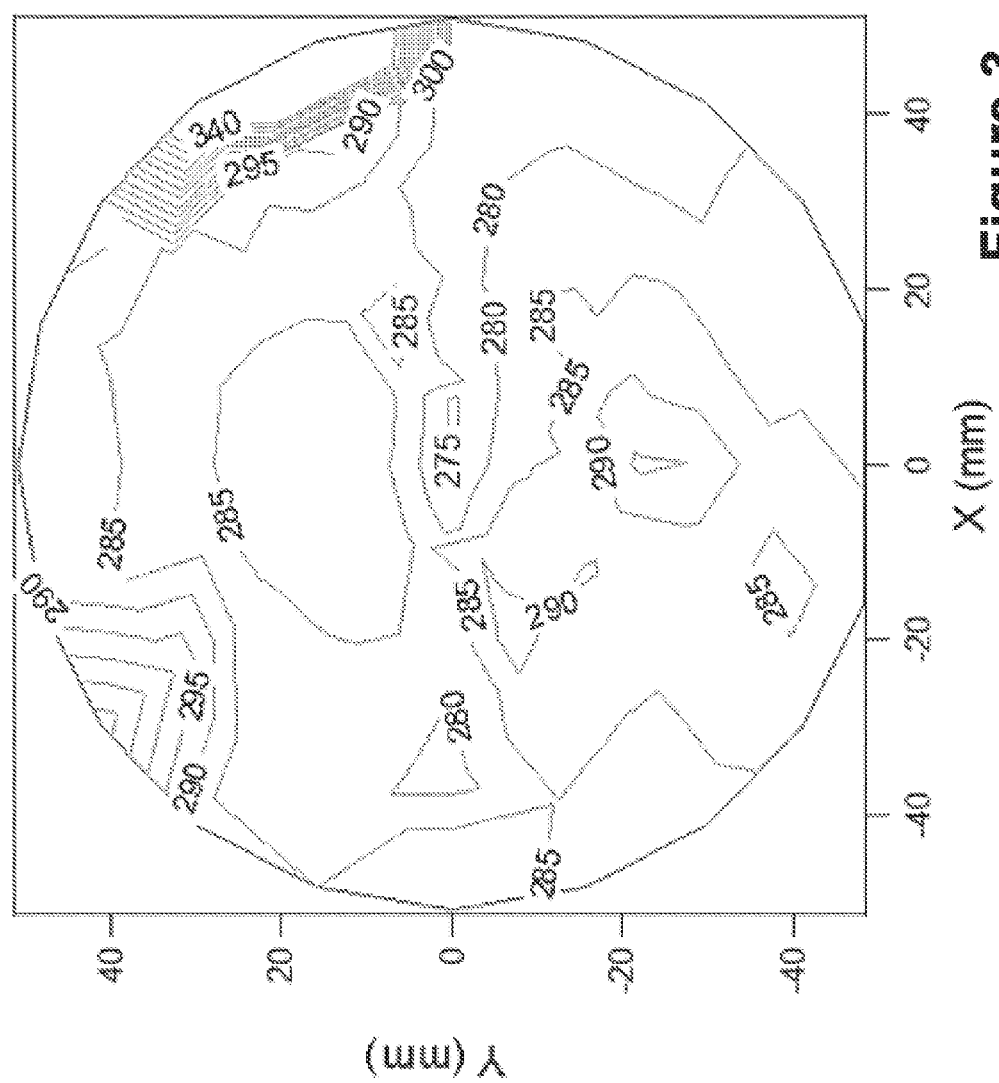
FIG. 3 illustrates an alternative example sheet resistance map of an embodiment of the HFET of FIG. 1, in accordance with various embodiments.

As noted above, in some embodiments the HFET 100 may achieve a relatively low sheet resistance. FIG. 2 depicts a sheet resistance map using experimental results in units of Ohms per square for an embodiment of HFET 100 wherein the cap layer 130 is a high temperature GaN. Similarly, FIG. 3 depicts a sheet resistance map using experimental results for an embodiment of HFET 100 wherein the cap layer 130 is a low temperature GaN. Again, the values given are in units of Ohms per square. The X-axis and Y-axis are measured in terms of millimeters (mm).

Figure 4:
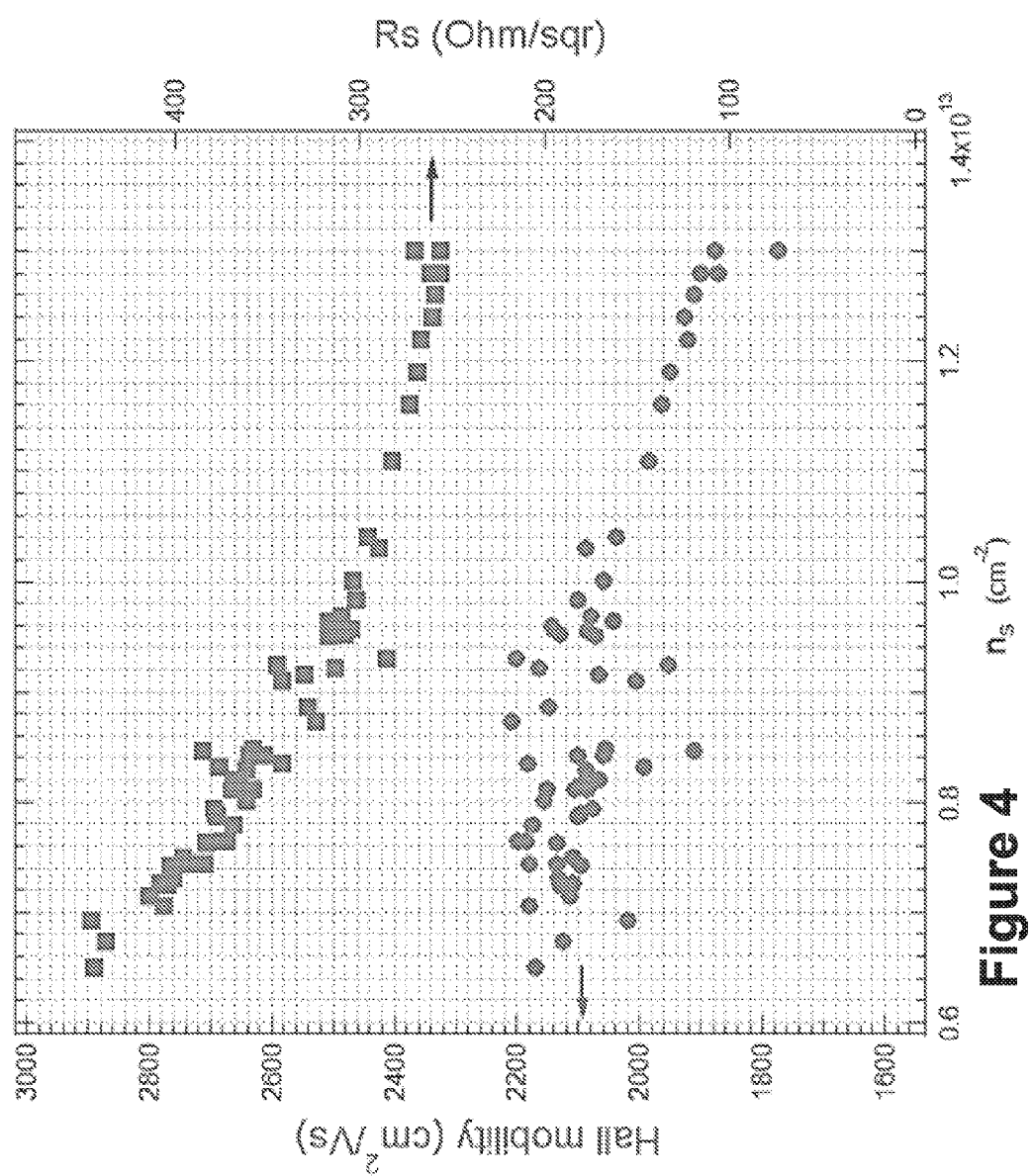
FIG. 4 illustrates example hall data of an embodiment of the HFET of FIG. 1, in accordance with various embodiments.

FIG. 4 depicts an example of hall data for HFETs with digital alloy barrier layers such as HFET 100. The upper square-shaped data depicts the sheet resistance, and is measured in Ohms, as indicated by the right Y-axis. The lower circle-shaped data depicts hall mobility and is measured in units of $cm^2/Vs$, as indicated by the left Y-axis. The X-axis depicts sheet charge density and is measured in units of $cm^{-2}$ ($n_s$). As described above, electron mobility of greater than 2200 $cm^2/Vs$ has been observed as depicted in FIG. 4.

Figure 5:
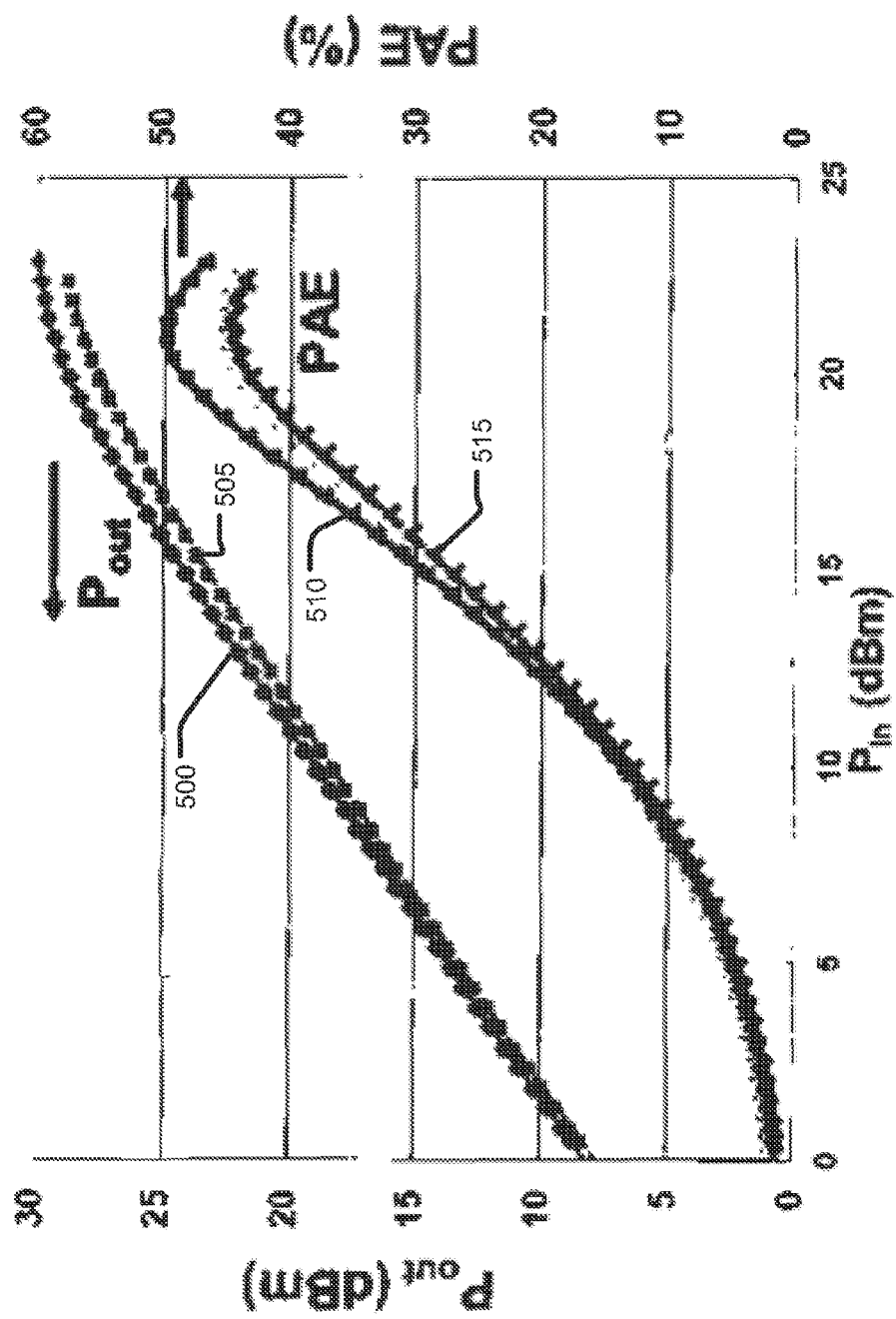
FIG. 5 illustrates an example power performance comparison of an embodiment of the HFET of FIG. 1, in accordance with various embodiments.

FIG. 5 depicts example experimental results of a power performance comparison of an embodiment of an HFET such as HFET 100 (referred to generally as HFET 100 for the purposes of description of this Figure), and a legacy HFET when run at a frequency of 35 gigahertz (GHz). Specifically, in FIG. 5 the comparison is between an HFET such as HFET 100 with a barrier layer 125 comprised of a superlattice of AlN layers 140 and GaN layers 135, and a legacy HFET with a barrier layer 125 comprised of AlGaN with a thickness of approximately 15 nanometers (nm). Line 500 depicts power output of HFET 100. Line 505 depicts power output of the legacy HFET. Line 510 depicts power added efficiency (PAE) of HFET 100. Line 515 depicts PAE of the legacy HFET. The left Y-axis depicts power output ($P_{out}$) in decibel-milliwatts (dBm). The right Y-axis depicts PAE as a percentage. The X-axis depicts power input ($P_{in}$) in dBm.

As can be seen the PAE peaks for both HFET 100 and the legacy HFET around $P_{in}$=20.86 dBm. At this peak $P_{in}$, the $P_{out}$ of HFET 100 is approximately 28.96 dBm, while the $P_{out}$ of the legacy HFET is approximately 28.14 dBm. Additionally, HFET 100 experiences a PAE of approximately 49.9%, while the legacy HFET experiences a PAE of approximately 44.7%. Finally, the HFET 100 has a power gain of approximately 8.1 decibels (dB), while the legacy HFET has a power gain of approximately 7.3 dB. Summarily, the HFET 100 may exhibit 21% (i.e., 0.8 dB) more output power. Additionally, HFET 100 may exhibit 0.8 dB higher power gain. Finally, HFET 100 may exhibit 5.2% points better PAE at 35 GHz.

As noted above, in some legacy HFETs, there may be limitations related to using AlGaN alloys in a back-barrier or buffer layer. Specifically, in some cases, the Al composition may need to be kept low, on the order of less than 8%, to avoid degradation of crystalline quality under normal growth conditions. Additionally, the thermal conductivity of the buffer may be degraded as the aluminum concentration is increased.

In embodiments of the present disclosure, digital alloys of $Al_yGa_{1-y}N$ and $Al_xGa_{1-x}N$ may be used in the back-barrier and/or buffer layer (hereinafter jointly referred to as the digital buffer layer, though it will be understood that in some embodiments the buffer layer may be different than the back-barrier layer, and the below description could apply to either a singular buffer layer or a singular back-barrier layer). In some embodiments the digital buffer layer may be referred to as a digital alloy buffer layer. The effective AlGaN Al concentration and its corresponding band-gap may be tuned by the thickness ratio, number of periods, and compositions x and y of the digital alloy buffer layer. In some embodiments, x may be equal to 0 and y may be equal to 1, which may indicate that the digital alloy buffer layer is composed of alternating layers of AlN and GaN. This digital alloy structure may reduce or otherwise eliminate alloy scattering in the digital alloy buffer layer.

In some embodiments, it may be desirable to use a digital alloy buffer layer (that is, a buffer layer that includes two alternating binary layers) because then a ternary alloy may be avoided Ternary alloys may result in enhanced phonon scattering in the HFET, which may result in degraded thermal conductivity.

FIG. 6 depicts an example of an HFET 600 with a digital alloy buffer layer 615. In embodiments, the HFET 600 may include a substrate layer 605, which may be similar to substrate layer 105 of HFET 100. Additionally, the HFET 600 may include a nucleation layer 610, which may be similar to nucleation layer 110 of HFET 100. Additionally, the HFET 600 may include a channel layer 620, which may be similar to channel layer 120 of HFET 100. In some embodiments, the channel layer 620 may be a material or alloy such as GaN, InGaN, or AlGaN with a band-gap less than the effective band-gap of the digital alloy buffer layer 615, described in greater detail below. Additionally, the HFET 600 may include a cap layer 630, which may be similar to cap layer 130 of HFET 100. In some embodiments, the HFET 600 may include a barrier layer, which may include or be comprised of AlGaN, AlInN, AlGaInN, a digital alloy as described with respect to FIG. 1, some other material or group-III Nitride alloy, or combinations thereof with a band-gap greater than the band-gap of the channel layer 620.

In some embodiments, the HFET 600 may include a digital alloy buffer layer 615. Similarly to the digital alloy barrier layer 125, the digital alloy buffer layer 615 may include alternating layers 635 and layers 640. In some embodiments, layers 635 may be GaN layer and layers 640 may be AlN layers, which may be similar to GaN layers 135 and AlN layers 140, respectively. In other embodiments, the digital alloy buffer layer 615 may include alternating layers 635 and 640 of $Al_yGa_{1-y}N$ and $Al_xGa_{1-x}N$. In some embodiments, the thicknesses and/or mole ratio fractions x and y of layers 640 and 635 may be kept constant across the thickness of the digital alloy buffer layer 615, while in other embodiments the thicknesses and/or mole ratios of layers 640 and 635 may vary or be graded across the thickness of the digital alloy buffer layer 615. In some specific embodiments, the digital alloy buffer layer 615 may include 60 layers 640 of AlN, each having a thickness of approximately 8.5 A. Additionally, the digital alloy buffer layer 615 may include 60 layers 635 of $Al_{0.02}Ga_{0.98}N$, each having a thickness of approximately 300 A. In other embodiments, more or fewer layers 635 or 640 may be used, and may be thicker or thinner than described above.

As described above, in embodiments the effective Al concentration Al % of the HFET 600 may be controlled by the thickness ratio and composition of the layers 635 and 640 in the digital alloy buffer layer 615. Specifically, if layer 635 is GaN and layer 640 is AlN, then the ratio of the thicknesses of GaN and AlN may dictate the effective Al concentration of the digital alloy buffer layer 615, as described above with respect to digital alloy barrier layer 125. In some embodiments, as described above, if layers 635 and 640 are GaN and AlN, respectively, then a wide range of effective Al concentrations may be achieved without compromising the overall crystal quality of the digital alloy buffer layer 615. If the layer 615 is a digital alloy back-barrier structure having a high effective Al concentration, for example, approximately 25%, the Al concentration of the barrier layer 625 may be increased. For example, in some embodiments the Al concentration of the barrier layer 625 may be increased to 30%, 50%, or greater. As a result, a high sheet carrier concentration on the order of $1 \times 10^{13}$ cm$^{-2}$ may be achieved.

Figure 7:
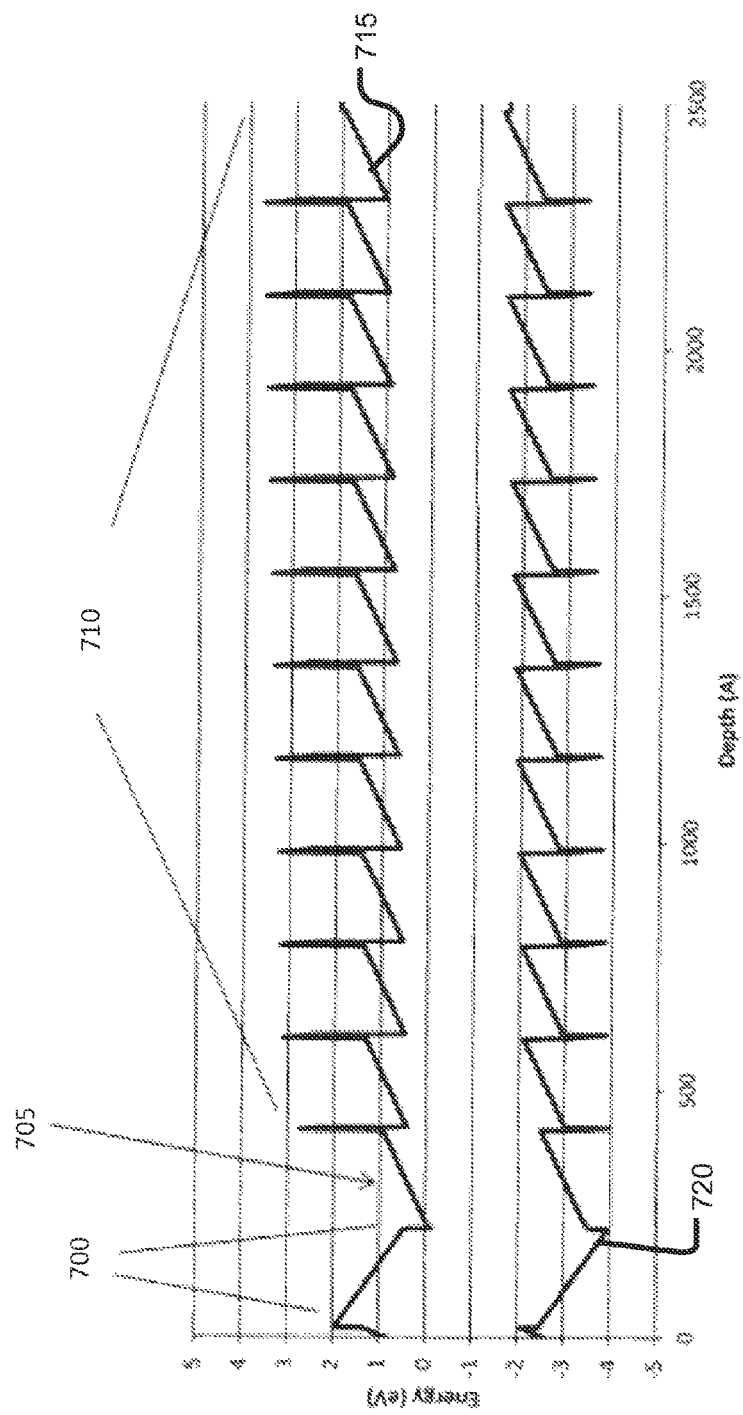
FIG. 7 illustrates an example equilibrium band diagram of an embodiment of the HFET of FIG. 6, in accordance with various embodiments.

In some embodiments, certain values of x and y for the layers 635 and 640 of $Al_yGa_{1-y}N$ and $Al_xGa_{1-x}N$ may increase carrier confinement of digital alloy buffer layer 615. For example, FIG. 7 depicts an example equilibrium band diagram for an HFET such as HFET 600 with a barrier layer comprised of a conventional $Al_{0.33}Ga_{0.67}N$ Schottky barrier layer 625 and a digital alloy buffer layer 615 with an effective Al concentration of approximately 4%. The Y-axis is depicted in electron volts (eV), while the X-axis is depth in Angstroms of the HFET 600. Line 715 depicts conductive band bottom (Ec) and line 720 depicts valance band top. As can be seen, both lines 715 and 720 experience an initial drop 700 at the top barrier layer 625, followed by a slight rise 705 attributable to the channel layer 620. Then, over the thickness 710 of the digital alloy buffer layer 615, the lines 715 and 720 periodically spike and fall, respectively, but not below the Fermi level at 0 eV for the conduction band or above the Fermi level at 0 eV for the valance band, thus not forming parallel electron or hole gas conduction channels.

Figure 8:
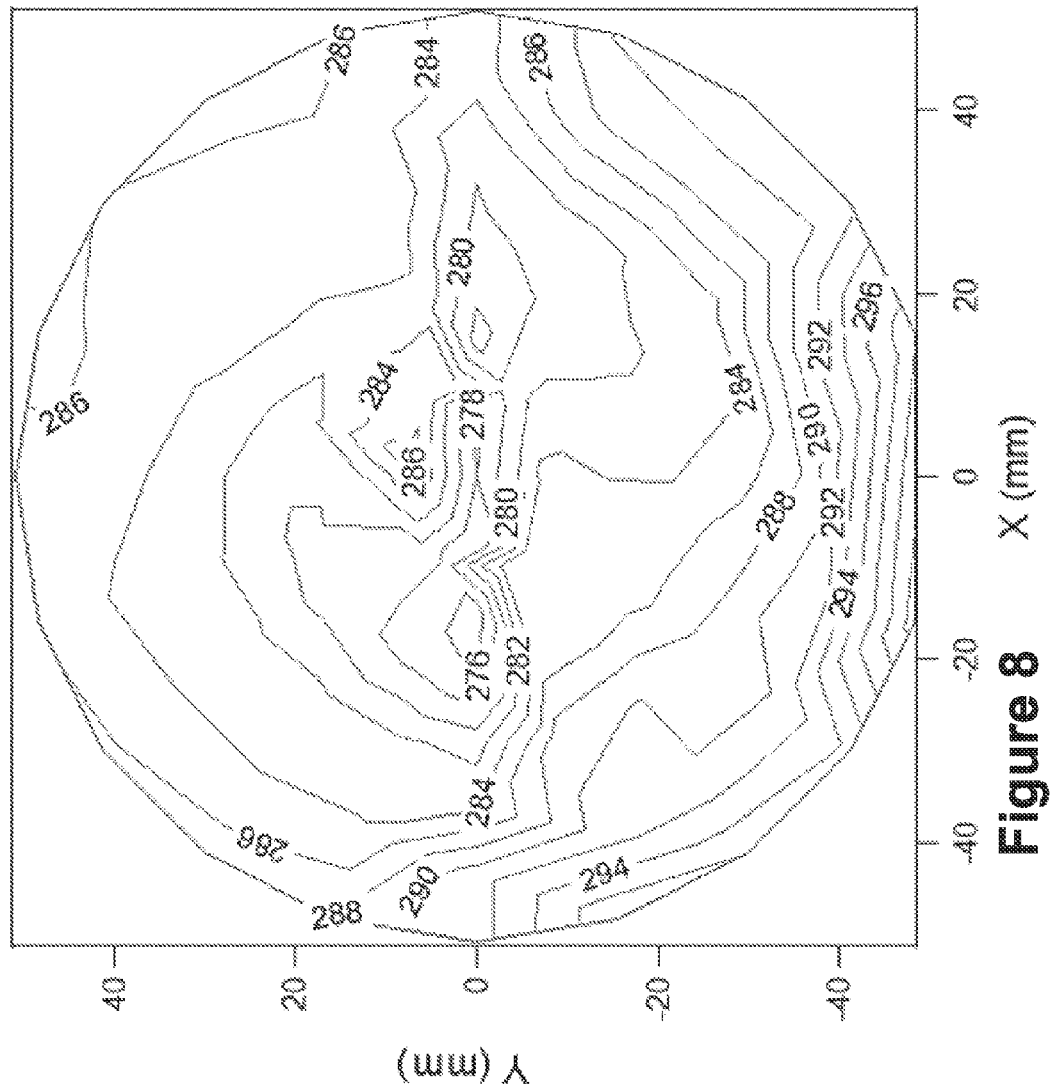
FIG. 8 illustrates an example sheet resistance map of an embodiment of the HFET of FIG. 6, in accordance with various embodiments.

FIG. 8 depicts a further feature of HFET 600. Specifically, FIG. 8 depicts an example sheet resistance map for HFET 600. HFET 600 may include further features or benefits. Specifically, when using a digital alloy buffer layer 615 that includes $Al_yGa_{1-y}N$ and $Al_xGa_{1-x}N$, an additional AlGaN alloy back-barrier layer or buffer layer may be un-necessary. Additionally, HFET 600 may exhibit improved thermal performance compared to a legacy HFET with an AlGaN alloy back-barrier or buffer layer.

In some embodiments, it may be desirable to construct an HFET such as HFET 900 of FIG. 9 that includes both a digital alloy buffer layer 915 and a digital alloy barrier layer 925. Specifically, in embodiments, the HFET 900 may include a substrate layer 905, nucleation layer 910, channel layer 920, and cap layer 930 which may be similar to substrate layer 105, nucleation layer 110, channel layer 120, and cap layer 130, respectively. In embodiments, HFET 900 may further include a digital alloy buffer layer 915 that includes alternating layers 935 and 940, which may be similar to digital alloy buffer layer 615 and layers 635 and 640, respectively. In some embodiments, the HFET 900 may further include a digital alloy barrier layer 925 that includes alternating layers 945 and 950, which may be similar to digital alloy barrier layer 125 and alternating layers 135 and 140, respectively.

Figure 10:
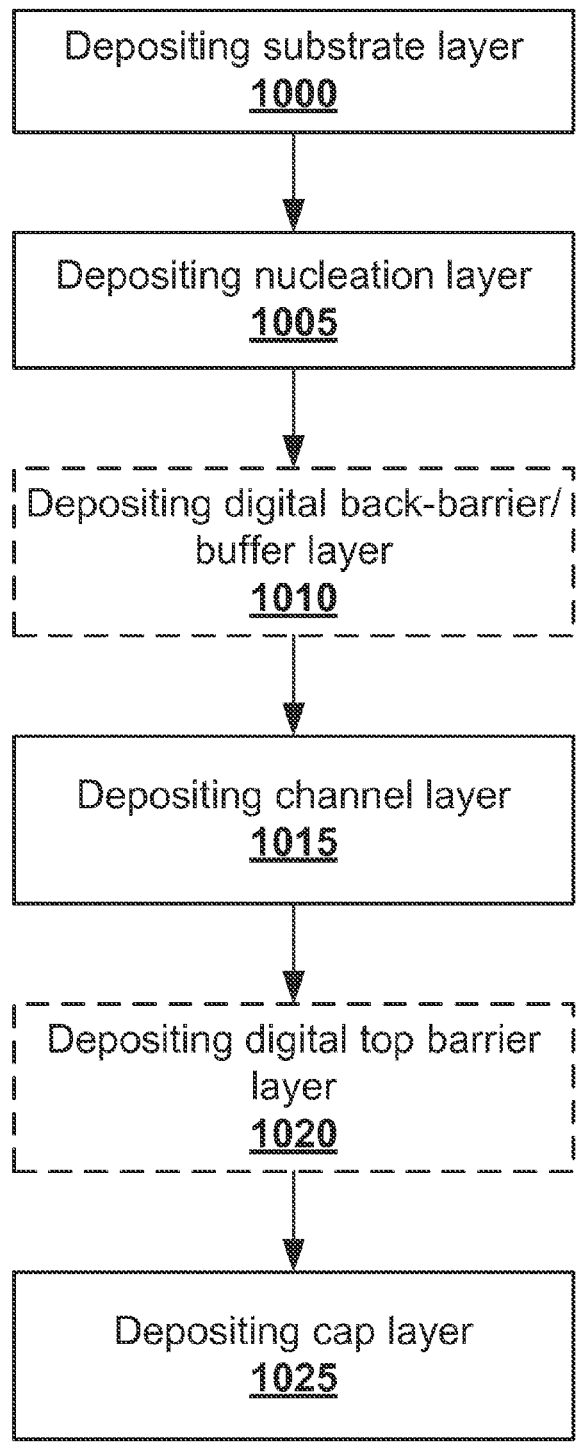
FIG. 10 illustrates an example process for manufacturing an HFET that includes a digital alloy layer, in accordance with various embodiments.

FIG. 10 depicts an example process for forming an HFET such as HFETs 100, 600, or 900. Initially, a substrate layer such as substrate layers 105, 605, or 905 may be deposited at 1000. Next, a nucleation layer such as nucleation layers 110, 610, or 910 may be deposited at 1005. Next, a digital back-barrier/buffer layer such as digital alloy buffer layers 615 or 915 may be deposited at 1010. In some embodiments, a legacy (that is, non-digital) buffer layer may be deposited instead of a digital alloy buffer layer if the HFET 100 is being constructed. Next, a channel layer such as channel layers 120, 620, or 920 may be deposited at 1015. Next, a digital alloy barrier layer such as digital alloy barrier layers 125 or 925 may be deposited at 1020. In some embodiments, a legacy (that is, non-digital) barrier layer may be deposited instead of the digital alloy barrier layer if the HFET 600 is being constructed. Finally, a cap layer such as cap layers 130, 630, or 930 may be deposited at 1025.

Figure 11:
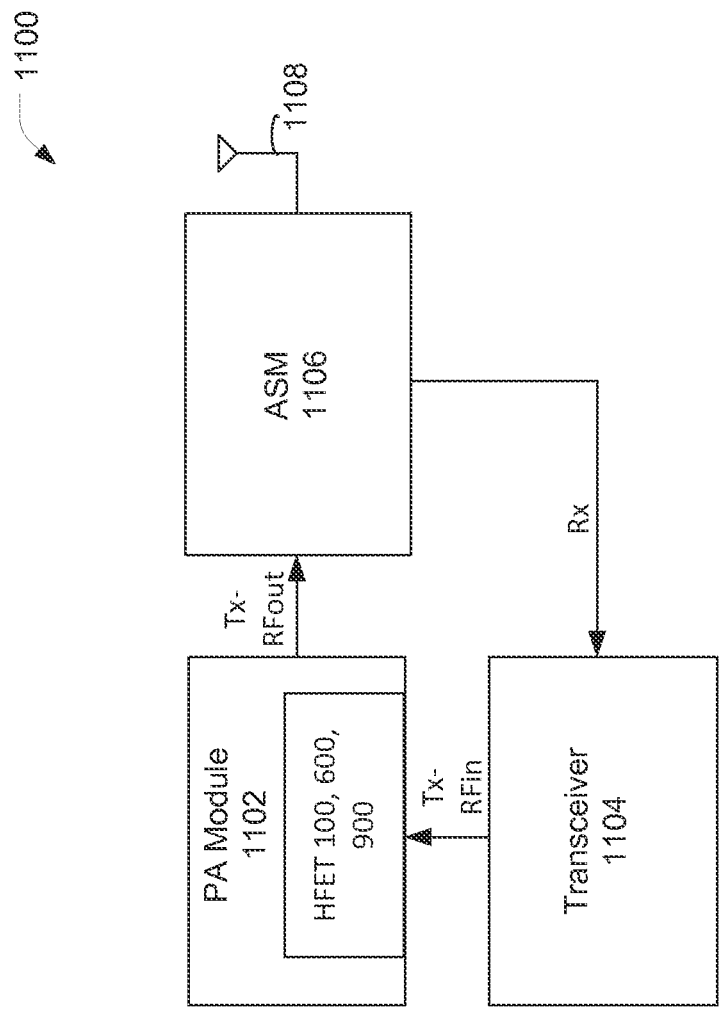
FIG. 11 is a block diagram of an exemplary wireless communication device, in accordance with various embodiments.

HFETs 100, 600, or 900 may be incorporated into a variety of systems. A block diagram of an example system 1100 is illustrated in FIG. 11. As illustrated, the system 1100 includes a power amplifier (PA) module 1102, which may be a radio frequency (RF) PA module in some embodiments. The system 1100 may include a transceiver 1104 coupled with the PA module 1102 as illustrated. The PA module 1102 may include one or more of HFETs 100, 600, or 900. In various embodiments, the HFETs 100, 600, or 900 may additionally/alternatively be included in the transceiver 1104 to provide, e.g., up-converting, or in an antenna switch module (ASM) 1106 to provide various switching functions.

The PA module 1102 may receive an RF input signal, RFin, from the transceiver 1104. The PA module 1102 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 11.

The amplified RF output signal, RFout, may be provided to the ASM 1106, which effectuates an over-the-air (OTA) transmission of the RF output signal, RFout, via an antenna structure 1108. The ASM 1106 may also receive RF signals via the antenna structure 1108 and couple the received RF signals, Rx, to the transceiver 1104 along a receive chain.

In various embodiments, the antenna structure 1108 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1100 may be suitable for any one or more of terrestrial and satellite communications, radar systems, and possibly in various medical applications. More specifically, in various embodiments, the system 1100 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
a buffer layer;
a channel layer directly coupled with the buffer layer;
a digital alloy barrier layer directly coupled with the channel layer opposite the buffer layer, wherein the digital alloy barrier layer includes at least a first and a second aluminum nitride (AlN) layer that alternates between at least a first and a second gallium nitride (GaN) layer such that the first AlN layer is between the first and the second GaN layers, and the first GaN layer is between the first and the second AlN layers; and
a cap layer directly coupled with the digital alloy barrier layer opposite the channel layer.

2. The apparatus of claim 1, wherein both the first and second GaN layers have a first thickness, and both the first and second AlN layers have a second thickness.

3. The apparatus of claim 1, wherein the first GaN layer has a first thickness and the second GaN layer has a second thickness that is different than the first thickness, and the first AlN layer has a third thickness and the second AlN layer has a fourth thickness that is different than the third thickness.

4. The apparatus of claim 1, wherein the cap layer includes GaN, AlN, or silicon nitride (SiNx).

5. The apparatus of claim 1, wherein the digital alloy barrier layer has a sheet carrier concentration that is greater than approximately $1 \times 10^{13}$ cm$^{-2}$.

6. The apparatus of claim 1, wherein the channel layer includes GaN, indium gallium nitride (InGaN), or aluminum gallium nitride (AlGaN).

7. The apparatus of claim 1, wherein the buffer layer includes GaN, an alloy back-barrier, or a digital alloy back-barrier.

8. The apparatus of claim 1, wherein the apparatus is a heterojunction field effect transistor (HFET).

9. An apparatus comprising:
a barrier layer;
a channel layer directly coupled with the barrier layer; and
a digital alloy layer directly coupled with the channel layer opposite the barrier layer, wherein the digital alloy layer includes at least a first layer with first relative concentrations of aluminum, gallium, and nitrogen, a second layer with second relative concentrations of aluminum, gallium, and nitrogen, a third layer with third relative concentrations of aluminum, gallium, and nitrogen, and a fourth layer with fourth relative concentrations of aluminum, gallium, and nitrogen, wherein the first relative concentration is different from the second relative concentration and the fourth relative concentration, and the third relative concentration is different than the second relative concentration and the fourth relative concentration.

10. The apparatus of claim 9, wherein the first and third layer include aluminum nitride (AlN).

11. The apparatus of claim 9, wherein the second and fourth layer include gallium nitride (GaN).

12. The apparatus of claim 9, wherein the first relative concentration and the third relative concentration are the same as each other, and the second relative concentration and the fourth relative concentration are the same as each other.

13. The apparatus of claim 9, wherein the digital alloy layer is a buffer layer.

14. The apparatus of claim 9, wherein the digital alloy layer is a back-barrier layer.

15. The apparatus of claim 9, wherein the first layer and the third layer have a same thickness as one another, and the second layer and the fourth layer have a same thickness as one another.

16. The apparatus of claim 9, wherein the digital alloy layer has an aluminum concentration that is greater than approximately 0%.

17. The apparatus of claim 9, further comprising a cap layer directly coupled with the barrier layer opposite the channel layer.

18. The apparatus of claim 9, wherein the apparatus is a heterojunction field effect transistor (HFET).

19. The apparatus of claim 9, wherein the channel layer includes a gallium nitride (GaN) based channel.

20. The apparatus of claim 9, wherein the barrier layer includes aluminum gallium nitride (AlGaN), aluminum indium nitride (AlInN), aluminum gallium indium nitride (AlGaInN), or a digital alloy.

* * * * *